(12) United States Patent
Choi et al.

(10) Patent No.: US 7,728,672 B2
(45) Date of Patent: Jun. 1, 2010

(54) RF AMPLIFIER

(75) Inventors: Yun-Ho Choi, Daejeon (KR); Young-Ho Kim, Daejeon (KR); Seok-Bong Hyun, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 12/118,562

(22) Filed: May 9, 2008

(65) Prior Publication Data
US 2009/0160558 A1     Jun. 25, 2009

(30) Foreign Application Priority Data
Dec. 21, 2007   (KR) ...................... 10-2007-0135148
Mar. 10, 2008   (KR) ...................... 10-2008-0022034

(51) Int. Cl.
*H03F 3/04* (2006.01)
(52) U.S. Cl. ...................... 330/296; 330/311
(58) Field of Classification Search ................. 330/285, 330/296, 311
See application file for complete search history.

(56) References Cited

U.S. PATENT DOCUMENTS

| | | | |
|---|---|---|---|
| 6,414,553 B1 * | 7/2002 | Luo | ............................ 330/296 |
| 6,893,101 B2 | 5/2005 | Marra et al. | |
| 7,274,258 B2 | 9/2007 | Wang | |
| 7,365,604 B2 * | 4/2008 | Luo et al. | .................... 330/296 |
| 7,397,309 B2 * | 7/2008 | Tanoi | ......................... 330/296 |
| 2007/0096823 A1 | 5/2007 | Wang et al. | |

FOREIGN PATENT DOCUMENTS

KR   1020010079373 A   8/2001

OTHER PUBLICATIONS

Cheng-Chi Yen et al., "A 0.25-μm 20-dBm 2.4-GHz CMOS Power Amplifier With an Integrated Diode Linearizer", IEEE Microwave and Wireless Components Letters, vol. 13, No. 2, Feb. 2003, pp. 45-47.
Rimal Deep Singh et al., "A Linear Mode CMOS Power Amplifier with Self-Linearizing Bias", ASSCC pp. 251-254, 2006 IEEE.

* cited by examiner

*Primary Examiner*—Khanh V Nguyen

(57) ABSTRACT

Provided is a radio frequency (RF) amplifier. The RF amplifier includes an amplification circuit amplifying an RF signal, a bias voltage generation circuit supplying a bias voltage of the amplification circuit, and a first bias resistor connected between the amplification circuit ad the bias voltage generation circuit, and having a predetermined resistance allowing the bias voltage to be affected by the RF signal.

5 Claims, 5 Drawing Sheets

RF AMPLIFIER

CROSS-REFERENCE TO RELATED APPLICATIONS

This U.S. non-provisional patent application claims priority under 35 U.S.C. §119 of Korean Patent Application No. 10-2007-0135148, filed on Dec. 21, 2007, and Korean Patent Application No. 10-2008-0022034, filed on Mar. 10, 2007, and the entire contents of which are hereby incorporated by references.

BACKGROUND OF THE INVENTION

The present invention disclosed herein relates to a radio frequency (RF) amplifier, and more particularly, to an RF amplifier including a bias circuit of which current amount varies with a level of an output power.

The present invention has been derived from research undertaken as a part of the information technology (IT) development business by the Ministry of Information and Communication and Institute for Information Technology Advancement of the Republic of Korea [Project management No.: 2005-S-017-0, Project title: ultra-low power RF/HW/SW integrated SoC].

High quality telecommunication can be realized using a method of increasing an output of a transmitter or a method of enhancing sensitivity of a receiver. However, the method of increasing an output of a transmitter is not preferable due to a limitation in effect on equipment and power capacity at an output terminal of the transmitter, economy, and the like. For this reason, the method of enhancing sensitivity of a receiver is more preferably used to realize high quality telecommunication. The sensitivity of the receiver may be represented as noise figure (NF) indicating a degree of a receiving signal separated from a noise. As the noise figure is smaller, the sensitivity is higher in general.

With the rapid development of various mobile telecommunication technologies using a frequency bandwidth of 400 MHz to 2.5 GHz, it becomes more important to develop radio frequency (RF) devices and design technologies. Since an RF amplifier has several disadvantageous such as a parasitic capacitor and a silicon substrate causing a lot of signal loss, and low breakdown voltage, there is a limitation in that the RF amplifier is applied to a system requiring higher linearity and output power than a compound device made of GaAs, InGaP, InP, etc. Therefore, it is inevitable to improve a typical RF amplifier driven by a constant current regardless of an output power level when considering a recent technology development trend to require the extension of an operating time of a terminal by optimizing current consumption at a low output power level and a high output power level.

A method of enhancing linearity of an RF amplifier may be mainly classified into two kinds, of which one is a method of canceling nonlinearly-generated components such as 3rd intermodulation distortion (IMD3), and another is a method of increasing 1-dB gain compression point (P1 dB) of an output power in the same circuit. Here, the 3rd intermodulation distortion (IMD3) is defined as the magnitude of a distortion signal generated due to intermodulation, and the 1-db gain compression point (P1 dB) is defined as an output power at the point where the output power of a real gain curve is 1 dB below the value of an extrapolated linear gain curve.

A typical RF amplifier includes a structure with high resistance to prevent the leakage of an RF signal, or a bias circuit of a current mirror structure. Such a bias circuit maintains a gate-source voltage (Vgs) of an input transistor constantly. The bias circuit of the typical RF amplifier supplies a bias voltage and current regardless of input/output power. However, there is a difference in a current ratio of a current flowing through a main circuit of the RF amplifier to a current supplied from the bias circuit depending on a power level. For this reason, the typical RF amplifier has nonlinearity as an output power increases. Further, the maximum output power of a transistor used in the RF amplifier also decreases.

SUMMARY OF THE INVENTION

The present invention provides a radio frequency (RF) amplifier including a bias circuit of which current amount varies with a level of an output power.

The present invention also provides an RF amplifier having enhanced linearity even though an output power increases.

Embodiments of the present invention provide RF amplifiers including: an amplification circuit amplifying an RF signal; a bias voltage generation circuit supplying a bias voltage of the amplification circuit; and a first bias resistor connected between the amplification circuit and the bias voltage generation circuit, and having a predetermined resistance allowing the bias voltage to be affected by the RF signal.

In some embodiments, the amplification circuit includes: a first transistor having a gate receiving the bias voltage and the RF signal, and a source connected to a ground terminal; and a second transistor having a drain connected to a power supply voltage terminal, a gate receiving a gate voltage, and a source connected to a drain of the first transistor. Herein, the bias voltage allows the first transistor to operate in a saturation region, and the gate voltage allows the second transistor to operate in a saturation region.

In other embodiments, the bias voltage generation circuit includes: a first bias transistor having a drain and a gate commonly connected to one end of the bias resistor, and a source connected to a ground terminal.

In still other embodiments, the bias voltage generation circuit includes: a second bias transistor having a drain connected to a reference voltage terminal, and a source connected to the one end of the first bias transistor; and a load connected between a gate of the second bias transistor and the ground terminal.

In even other embodiments, the load includes: a third bias transistor having a drain and a gate commonly connected to the gate of the second bias transistor; a fourth bias transistor having a drain and a gate commonly connected to a source of the third bias transistor, and a source connected to the ground terminal; and a second bias resistor connected between the reference voltage terminal and the drain of the third bias transistor.

In yet other embodiments, the load is connected between the gate of the second bias transistor and the ground terminal, and further includes a bias capacitor functioning to reduce impedance at a corresponding frequency.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Hereinafter, an exemplary embodiment of the present invention will be described with the accompanying drawings.

A radio frequency (RF) amplifier according to the present invention increases its linearity by varying a current of a bias circuit according to a variation in a current of a main circuit amplifying an RF signal.

Figure 1:
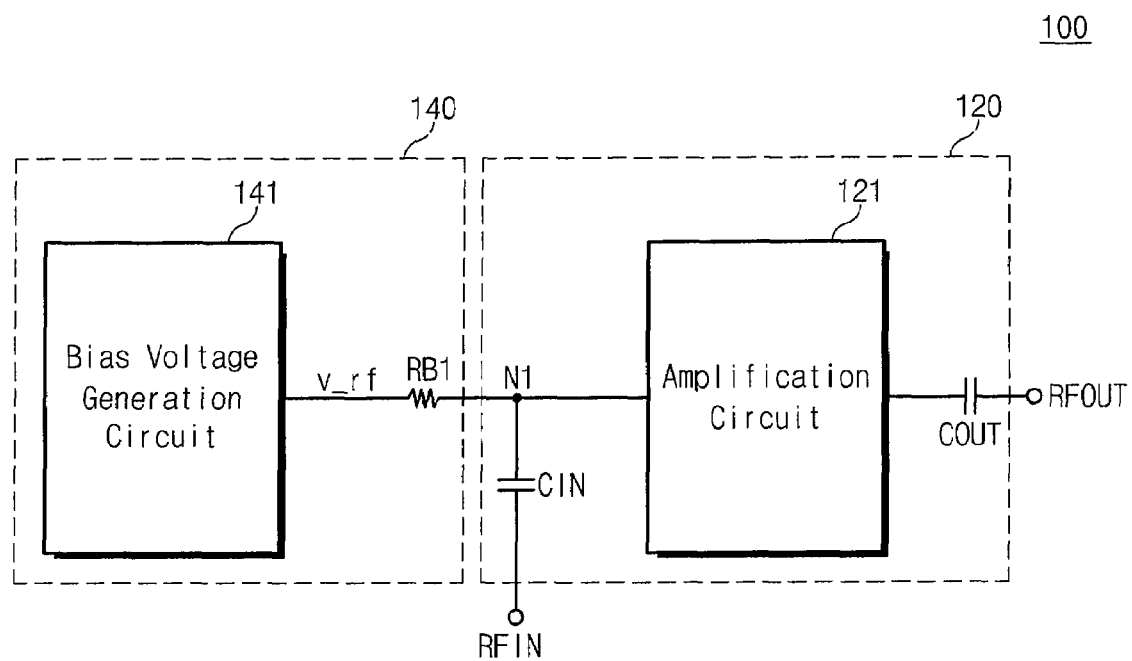
FIG. 1 is a block diagram of a radio frequency (RF) amplifier according to the present invention.

FIG. 1 is a block diagram of an RF amplifier 100 according to the present invention. Referring to FIG. 1, the RF amplifier 100 includes a main circuit 120 amplifying an RF signal RFIN, and a bias circuit 140 setting bias conditions, e.g., voltage and current, of the main circuit 120. The bias circuit 140 of the present invention is configured such that it is affected by the input RF signal RFIN. To this end, the bias circuit 140 includes a bias resistor RB1 configured to transfer an RF voltage v_rf from the input RF signal RFIN.

Referring to FIG. 1 again, the main circuit 120 includes an input capacitor CIN removing a direct current (DC) component from the input RF signal RFIN, an amplification circuit 121 amplifying the RF signal from which the DC component is removed, and an output capacitor COUT removing a DC component from the amplified RF signal and then outputting the amplified RF signal from which the DC component is removed.

The bias circuit 140 includes a bias voltage generation circuit 141 supplying a bias voltage of the amplification circuit 121, and the bias resistor RB1 connected between the voltage generation circuit 141 and the amplification circuit 121. Herein, the bias resistor RB1 is configured such that a voltage level of the input RF signal RFIN drops to the RF voltage v_rf affecting the bias voltage generation circuit 141. For example, if the RF signal from which the DC component is removed through the input capacitor CIN is '100', the bias resistor RB1 may be configured such that the RF signal corresponding to '99' affects the amplification circuit 121, and the RF signal corresponding to '1' affects the bias voltage generation circuit 141.

Figure 2:
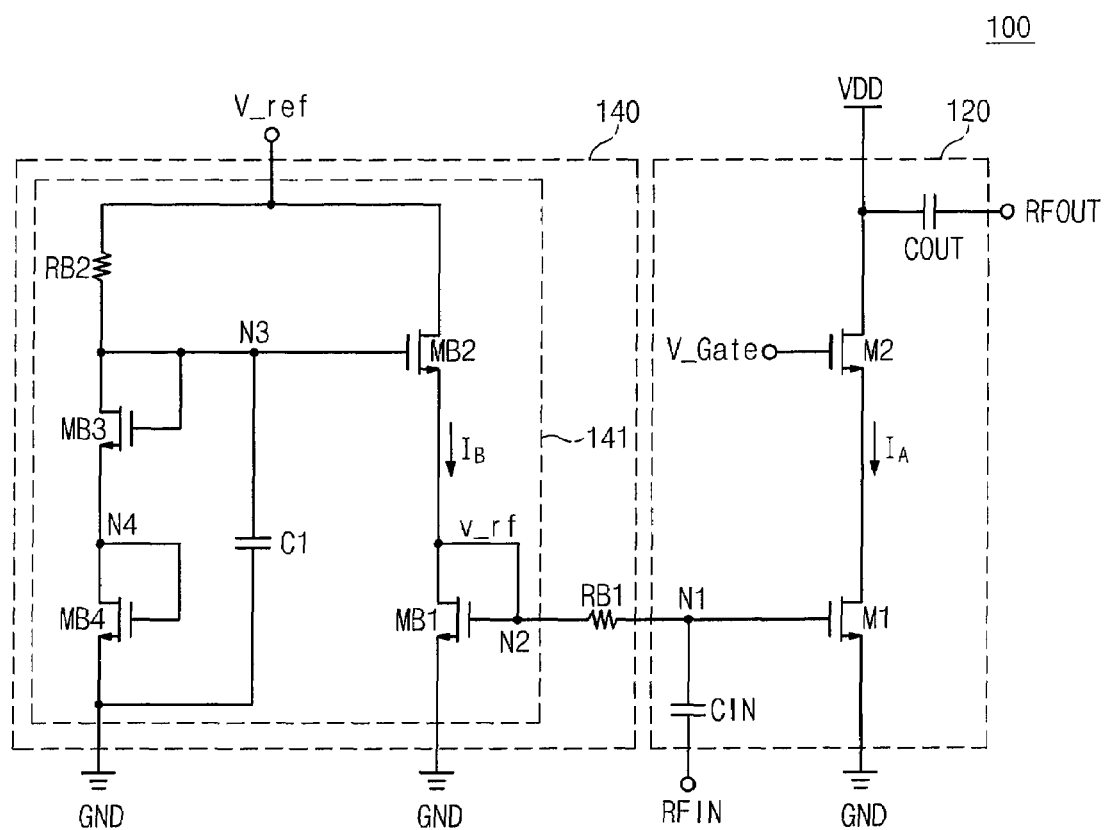
FIG. 2 is a circuit diagram illustrating an embodiment of the RF amplifier in FIG. 1.

FIG. 2 is a circuit diagram illustrating an embodiment of the RF amplifier 100 in FIG. 1. Referring to FIG. 2, the RF amplifier 100 according to the embodiment of the present invention includes a main circuit 120 having a cascode configuration, and a bias circuit 140 having a current-mirror configuration. The RF amplifier 100 of the present invention is constructed such that a bias current $I_B$ also varies as an amplified current $I_A$ of the main circuit 120 varies. Specifically, the bias current $I_B$ of the bias circuit 140 increases as the amplified current $I_A$ of the main circuit 120 increases; however, the bias current $I_B$ of the bias circuit 140 decreases as the amplified current $I_A$ of the main circuit 120 decreases. That is, the bias circuit 140 may be configured to maintain a ratio of the amplified current $I_A$ of the main circuit 120 to the bias current $I_B$ of the bias circuit 140 constantly.

The main circuit 120 receives the RF signal RFIN, and then inverts and amplifies it to output an output signal RFOUT. The main circuit 120 illustrated in FIG. 2 has a cascode configuration configured with two transistors, i.e., first and second transistors M1 and M2. Although the main circuit 120 in FIG. 2 has the cascode configuration, it is obvious to a person having ordinary skill in the art that the main circuit 120 of the present invention is not limited to such a cascode configuration. The first transistor M1 amplifies the RF signal RFIN, and the second transistor M2 performs a function of resisting a high drain voltage. Here, a gate voltage V_Gate may be applied to the second transistor M2 such that the second transistor M2 operates in a saturation region.

The input and output capacitors CIN and COUT of the main circuit 120 are used to pass a high frequency signal but remove a DC component.

Amplifying operation of the main circuit 120 will be described below. The input RF signal RFIN is transferred to a gate of the first transistor M1 via the input capacitor CIN. The first transistor M1 is turned on according to a bias voltage applied from the bias circuit 140, and the second transistor M2 is turned on according to the gate voltage V_Gate. Both the first and second transistors M1 and M2 may operate in saturation regions. Therefore, the current of the main circuit 120 is discharged to a ground terminal GND in response to the RF signal RFIN input to the first transistor M1, thereby generating the output signal RFOUT. The output signal RFOUT fluctuates based on the power supply voltage VDD to amplify the input signal RFIN. As a result, the main circuit 120 inverts and amplifies the input RF signal RFIN, thereby outputting the inverted and amplified RF signal.

The bias circuit 140 does not only provide bias conditions of the main circuit 120 but also is affected by the RF signal RFIN. Here, the bias circuit 140 is relatively less affected by the RF signal RFIN than the main circuit 120. In particular, the bias circuit 140 of the present invention is configured such that the amplified current $I_A$ of the main circuit 120 varies with the RF signal and the bias current $I_B$ also varies simultaneously.

Referring to FIG. 2 again, the bias circuit 140 includes first to fourth transistors MB1 to MB4, first and second bias resistors RB1 and RB2, and a bias capacitor C1. The first bias resistor RB1 is connected between a first node N1 and a second node N2. The second bias resistor RB2 is connected between the reference voltage (V_ref) terminal and the third node N3. The first bias transistor MB1 includes a gate and a drain commonly connected to the second node N2, and a source connected to the ground terminal GND. The second bias transistor MB2 includes a drain connected to the reference voltage (V_ref) terminal, a source connected to the second node N2, and a gate connected to the third node N3. The third bias transistor MB3 includes a drain and a gate commonly connected to the third node N3, a source connected to a fourth node N4. The fourth bias transistor MB4 includes a drain and a gate commonly connected to the fourth node N4, and a source connected to the ground terminal GND. The bias capacitor C1 is connected between the third node N3 and the ground terminal GND.

The bias resistor RB1 of the present invention has a predetermined resistance allowing the bias voltage to be affected by the RF signal RFIN. Accordingly, the RF voltage v_rf is generated at the second node N2 by the input of the RF signal RFIN. Resultantly, in the bias circuit 140 of the present invention, a gate-source voltage ($V_{GS\_MB2}$) of the second bias transistor MB2 varies with the RF signal RFIN, and therefore the bias current $I_B$ also varies with the gate-source voltage ($V_{GS\_MB2}$).

The RF amplifier 100 of the present invention may have a configuration to constantly maintain a current ratio of the current of the main circuit 120 to the current of the bias circuit 140 even though an output power level varies. Consequently, nonlinear operation of the RF amplifier 100 is suppressed, and a 1-db gain compression point (P1 dB) is enhanced.

Figure 3:
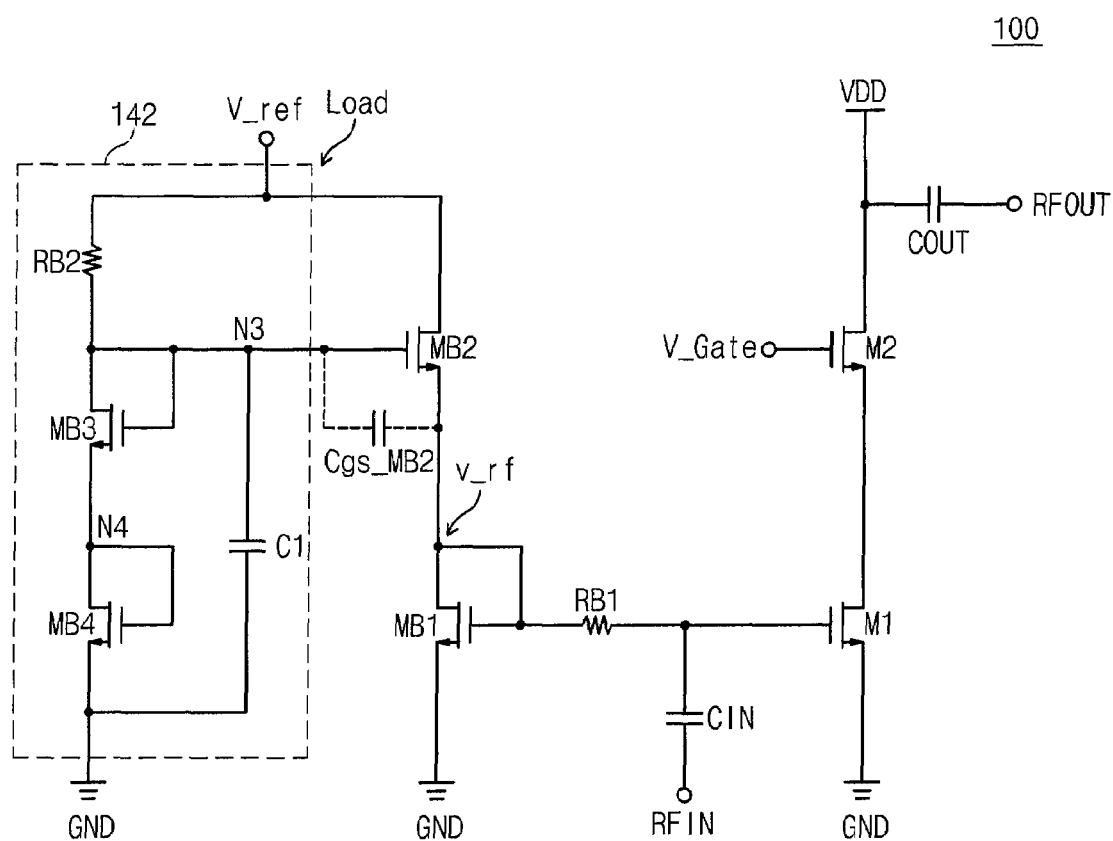
FIG. 3 is a circuit diagram illustrating operation of the RF amplifier in FIG. 2.

FIG. 3 is a circuit diagram illustrating current variation of the bias circuit 140 in FIG. 2. Referring to FIG. 3, the bias circuit 140 includes a load 142. The load 142 includes the second bias resistor RB2, and the first through fourth bias transistors MB1, MB2, MB3 and MB4. Herein, the RF voltage v_rf is a component affecting the bias circuit 140 when the RF signal RFIN is input.

Figure 4:
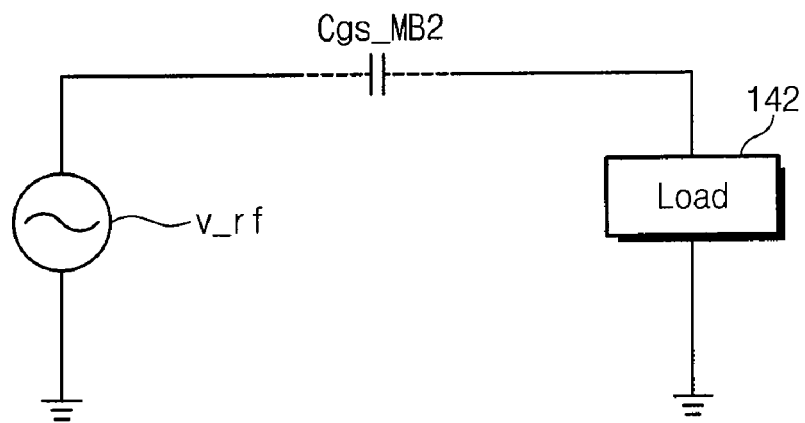
FIG. 4 is an equivalent circuit diagram of a bias circuit in FIG. 3.

FIG. 4 is an equivalent circuit diagram of the bias circuit 140 in FIG. 3. Referring to FIG. 4, the bias circuit 140 includes a capacitor Cgs_MB2 between an RF voltage (v_rf) source and the load 142. Here, the capacitor Cgs_MB2 is a parasitic capacitor of the second bias transistor MB2. Therefore, a voltage (v_Load) of a signal transferred to the node N2 through the capacitor Cgs_MB2 is calculated by following Equation 1.

$$v\_Load = \frac{Z\_Load}{\frac{1}{jw \cdot C_{gs\_MB2}} + Z\_Load} \cdot v\_rf \quad \text{(Equation 1)}$$

where the capacitance $C_{gs\_MB2}$ of the capacitor Cgs_MB2 is determined by a gate area of the second bias transistor MB2 of the bias circuit 140. The gate voltage of the transistor MB2, i.e., $V_{GS\_MB2}$, is affected by the impedance (Z_Load) of the load 142, which is seen from following Equations 2 and 3.

$$Z\_Load \approx 0, v\_Load \approx 0 \quad \text{(Equation 2)}$$

$$Z\_Load \approx \infty, v\_Load \approx v\_rf \quad \text{(Equation 3)}$$

Therefore, the gate-source voltage ($V_{GS\_MB2}$) of the second bias transistor MB2 of the bias circuit 140 satisfies Equation 4 below when the RF signal is applied to the main circuit 120.

$$V_{GS(DC\_Bias)} \leq V_{GS\_MB2} \leq V_{GS(DC\_Bias\text{-}rms(v\_rf))} \quad \text{(Equation 4)}$$

Although the bias circuit 140 of the present invention has a current mirror structure, it is obvious to a person having ordinary skill in the art that the bias circuit 140 is not limited to the current mirror structure. The bias circuit 140 of the present invention may be a circuit having an equivalent circuit diagram of FIG. 4.

The bias circuit 140 of the present invention includes the bias capacitor C1 to reduce the impedance (Z_Load) of the load. However, the bias circuit 140 of the RF amplifier 100 according to the present invention is not limited thereto. Besides the bias capacitor C1, therefore, the bias circuit 140 of the present invention may include other elements that can reduce the impedance (Z_Load) at an RF frequency.

Figure 5:
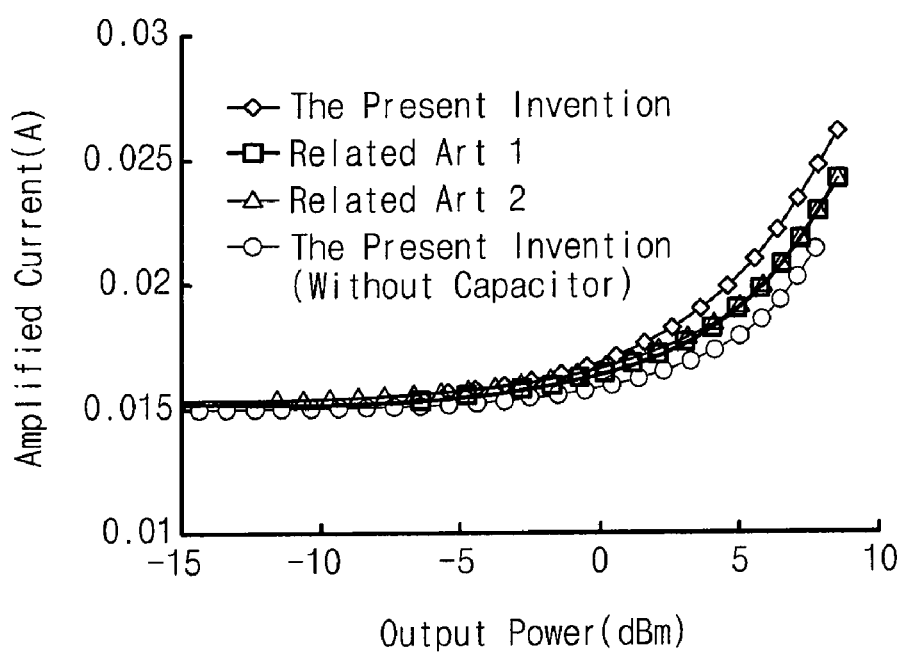
FIG. 5 is a graph illustrating current amount of a main amplifier versus an output power level, which compares RF amplifiers of the present invention with related art RF amplifiers.

FIG. 5 is a graph illustrating the amount of current of a main amplifier versus an output power level, which compares RF amplifiers of the present invention with related art RF amplifiers. Referring to FIG. 5, it can be observed that the amount of amplified current increases as the maximum output power increases in all the related art and inventive RF amplifiers.

Figure 6:
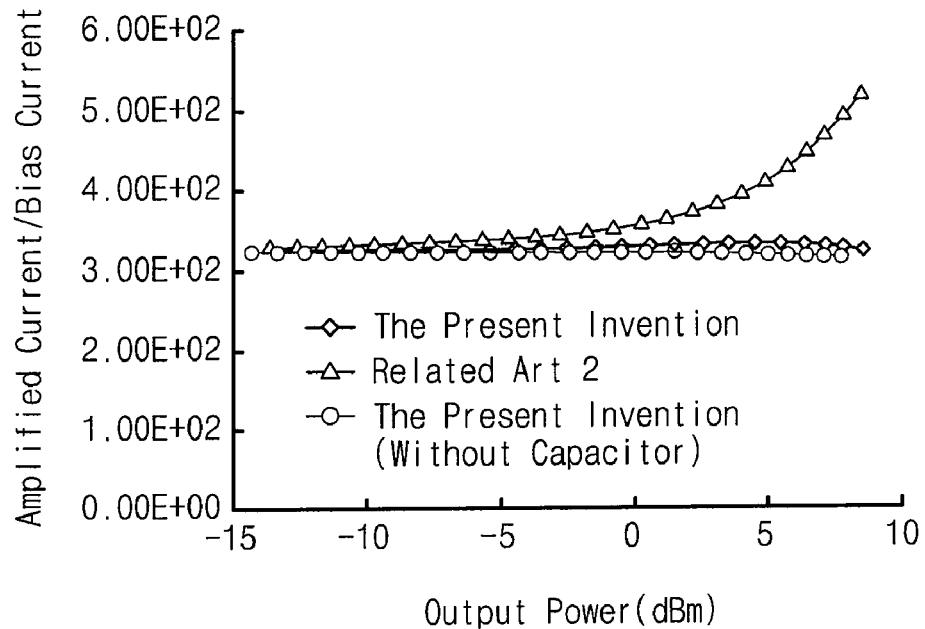
FIG. 6 is a graph illustrating a current ratio of an amplified current to a bias current according to an output power level.

FIG. 6 is a graph illustrating a current ratio of an amplified current of the main circuit 120 to a bias current of the bias circuit 140 according to an output power level. Referring to FIG. 6, in the related art RF amplifier, a constant bias current flows regardless of the amplified current of the main circuit 120. Accordingly, a current ratio of the amplified current of the main circuit to the current of the bias circuit varies with the output power level in the related art RF amplifier, which is symbolized by a triangle in the graph. Such a variation in the current ratio causes the transistor of the RF amplifier to operate nonlinearly according to an increase in output power, thereby reducing the 1-db gain compression point (P1 dB). In the RF amplifiers according to the present invention, however, a current ratio of the amplified current to the bias current is maintained constantly even though the output power level increases. Regardless of whether or not the bias capacitor C1 exists in the RF amplifier, the current ratio of the amplified current to the bias current is maintained constantly.

Figure 7:
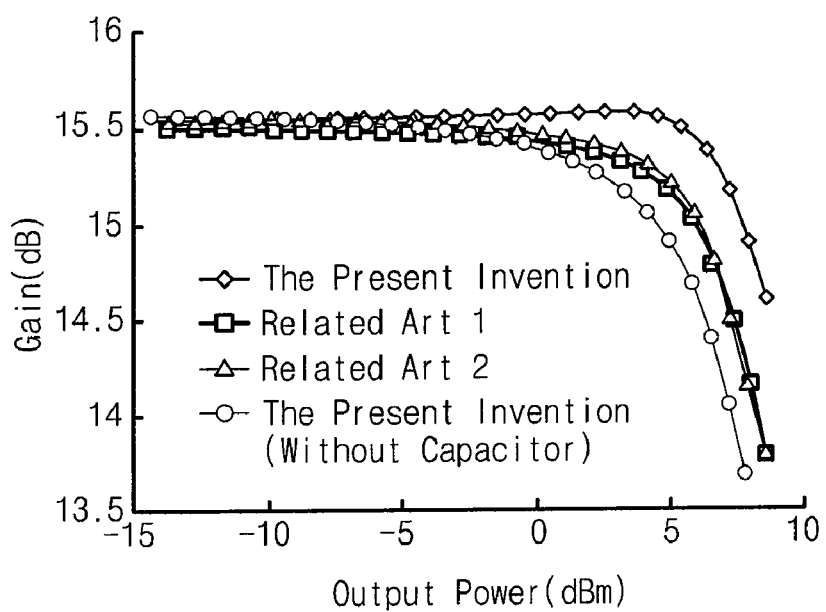
FIG. 7 is a graph illustrating a gain of an RF amplifier versus an output power level.

FIG. 7 is a graph illustrating a gain of an RF amplifier versus an output power level. Referring to FIG. 7, the RF amplifier of the present invention, which is symbolized by a diamond in the graph, has higher 1-dB gain compression point (P1 dB) than the related art RF amplifiers.

If, however, the bias circuit of the present invention does not include the capacitor C1 for reducing the impedance of the input RF signal, the 1-dB gain compression point (P1 dB) of the RF amplifier, which is symbolized by a circle in the graph, becomes lower although this RF amplifier provides the constant current ratio of the amplified current to the bias current. This is because the RF signal input to the bias circuit does not have an effect on the gate-source voltage ($V_{GS\_MB2}$) of the second bias transistor MB2 but is lost due to a reduction in the resistance of the resistor RB1 between the bias circuit and the main circuit.

According to the present invention, a current supplied from a bias circuit varies with a variation in an output power level, thus increasing linearity of an RF amplifier.

Furthermore, the RF amplifier of the present invention has a higher 1-db gain compression point (P1 dB) or does not need an additional current for linear operation.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A radio frequency (RF) amplifier, comprising:
   an amplification circuit amplifying an RF signal;
   a bias voltage generation circuit supplying a bias voltage of the amplification circuit;
   a first bias resistor connected between the amplification circuit and the bias voltage generation circuit, and having a predetermined resistance allowing the bias voltage to be affected by the RF signal,
   wherein the bias voltage generation circuit comprises:
   a first bias transistor comprising a drain and a gate commonly connected to one end of the first bias resistor, and a source connected to a ground terminal;

a second bias transistor comprising a drain connected to a reference voltage terminal, and a source connected to the one end of the first bias resistor; and a load connected between a gate of the second bias transistor and the ground terminal.

2. The RF amplifier of claim 1, wherein the load comprises:

a third bias transistor comprising a drain and a gate commonly connected to the gate of the second bias transistor;

a fourth bias transistor comprising a drain and a gate commonly connected to a source of the third bias transistor, and a source connected to the ground terminal; and a second bias resistor connected between the reference voltage terminal and the drain of the third bias transistor.

3. The RF amplifier of claim 2, wherein the load is connected between the gate of the second bias transistor and the ground terminal, and further comprises a bias capacitor functioning to reduce impedance at a corresponding frequency.

4. A radio frequency (RF) amplifier, comprising:

an amplification circuit amplifying an RF signal, the amplification circuit including:

a first transistor comprising a gate configured to receive the bias voltage and the RF signal, and a source connected to a ground terminal, and a second transistor comprising a drain connected to a power supply voltage terminal, a gate configured to receive a gate voltage, and a source connected to a drain of the first transistor;

a bias voltage generation circuit supplying a bias voltage of the amplification circuit, the bias voltage generation circuit including:

a first bias transistor comprising a drain and a gate commonly connected to one end of a bias resistor, and a source connected to a ground terminal, a second bias transistor comprising a drain connected to a reference voltage terminal, and a source connected to the one end of the bias resistor, and a load connected between a gate of the second bias transistor and the ground terminal; and wherein the bias resistor is connected between the amplification circuit and the bias voltage generation circuit, and having a predetermined resistance allowing the bias voltage to be affected by the RF signal, wherein the bias voltage allows the first transistor to operate in a saturation region, and the gate voltage allows the second transistor to operate in a saturation region.

5. The RF amplifier of claim 4, wherein the load is connected between the gate of the second bias transistor and the ground terminal, and further comprises a bias capacitor functioning to reduce impedance at a corresponding frequency.

* * * * *